United States Patent [19]

Katoh et al.

[11] Patent Number: 4,743,868
[45] Date of Patent: May 10, 1988

[54] HIGH FREQUENCY FILTER FOR ELECTRIC INSTRUMENTS

[75] Inventors: Taisei Katoh, Aichi; Toru Yamazaki, Kariya; Toshiki Saburi, Anjo, all of Japan

[73] Assignee: Nippondenso Co., Ltd., Kariya, Japan

[21] Appl. No.: 847,533

[22] Filed: Apr. 3, 1986

[30] Foreign Application Priority Data

Apr. 3, 1985 [JP] Japan ............................. 60-70389
May 15, 1985 [JP] Japan ............................. 60-102873

[51] Int. Cl.$^4$ ............................................. H04B 3/28
[52] U.S. Cl. ........................................ 333/12; 333/204; 333/246; 361/400
[58] Field of Search ............... 333/167, 12, 185, 204, 333/172, 246; 361/400; 174/395, 52, 181, 184

[56] References Cited

U.S. PATENT DOCUMENTS

| Re. 29,258 | 6/1977 | Fritz | 333/182 |
|---|---|---|---|
| 2,877,389 | 3/1959 | Wiener | 333/185 X |
| 3,340,491 | 9/1967 | Deakin | 361/401 X |
| 3,478,251 | 11/1969 | Perotto et al. | 174/52 R |
| 3,483,308 | 12/1969 | Wakely | 174/52 R |
| 4,278,957 | 7/1981 | Starai et al. | 333/202 |
| 4,342,069 | 7/1982 | Link | 361/395 X |
| 4,495,546 | 1/1985 | Nakamura et al. | 361/413 X |
| 4,519,664 | 5/1985 | Tillotson | 333/12 X |
| 4,540,226 | 9/1985 | Thompson et al. | 361/401 X |
| 4,600,256 | 7/1986 | Anttila | 333/185 X |
| 4,656,442 | 4/1987 | Hayakawa | 361/395 X |

FOREIGN PATENT DOCUMENTS 0162147 11/1985 European Pat. Off. ............ 333/185
57-27100 2/1982 Japan .

OTHER PUBLICATIONS

Hermann et al., "Vertically Mounted Module", IBM Tech. Disc. Bulletin, vol. 27, No. 3, Aug. 1984, pp. 1599-1600.

Primary Examiner—Eugene R. LaRoche
Assistant Examiner—Ham, Seung
Attorney, Agent, or Firm—Cushman, Darby & Cushman

[57] ABSTRACT

A high frequency filter in combination with an internal electronic circuit element of the flat-plate type, such as a hybrid integrated circuit element contained within a casing, includes an electrode member arranged on a circuit board within the casing to be grounded, an insulation substance layer, integrally formed on the electrode member and being made of a dielectric material whose dielectric constant decreases or increases in accordance with an increase or a decrease of wireless frequency applied thereto, and an electrode strip integrally formed on the insulation substance layer for connection to an external electric circuit. The internal electronic circuit element is integrally provided on either the electrode member or the insulation substance layer and connected to the electrode strip, and the electrode member is mounted on the circuit board to carry the electronic circuit element in place.

15 Claims, 8 Drawing Sheets

HIGH FREQUENCY FILTER FOR ELECTRIC INSTRUMENTS

BACKGROUND OF THE INVENTION

1. Field of the Invention

The present invention relates to a high frequency filter for an electric instruments, and more particularly to a high frequency filter for protecting the electric instruments from inductive interference caused by various electromagnetic waves from a broadcasting station, an amateur wireless station, a civil wireless station, a personal wireless system, a military radar system and the like.

2. Description of the Prior Art

Although various high frequency filters of this kind have been proposed, reliable protection of the electric instruments from the inductive interference may not be effected due to insufficient band width of the filter characteristic. Meanwhile, a presently proposed high frequency filter effective in a broad radio frequency band is costly to manufacture. For the purpose of eliminating such problems, in copending U.S. patent application Ser. No. 755,654, filed on July 16, 1985, the inventors have proposed a high frequency filter which can be constructed at a low cost to provide a distributed constant circuit effective in a broad radio frequency band. In use in combination with various internal electronic circuit elements, however, the high frequency filter is arranged separately from the electronic circuit elements on a circuit board. In such arrangement of the high frequency filter in a casing, various wiring layers are formed on the circuit board between the high frequency filter and the electronic circuit elements. As a result, a limited space in the casing is inevitably occupied by the wiring layers.

SUMMARY OF THE INVENTION

It is, therefore, a primary object of the present invention to provide a high frequency filter which can be arranged in combination with various internal electronic circuit elements in a limited space.

Another object of the present invention is to provide a high frequency filter, having the above-described characteristic, which is arranged to protect the internal electronic circuit elements from the inductive interference in a more reliable manner.

According to the present invention, there is provided a high frequency filter adapted for use in combination with an internal electronic circuit element arranged to be carried on a circuit board of an insulation material and to be connected to an external electric circuit.

The high frequency filter comprises:
an electrode member arranged to be grounded;
an insulation substance layer integrally formed on the electrode member, the insulation substance layer being made of a dielectric material whose dielectric constant decreases or increases in accordance with an increase or decrease of wireless frequency applied thereto; and
an electrode strip integrally formed on the insulation substance layer for connection to the external electric circuit;
wherein the internal electronic circuit element is integrally provided on either the electrode member or the insulation substance layer and connected to the electrode strip, and the electrode member is mounted on the circuit board to carry the electronic circuit element in place.

BRIEF DESCRIPTION OF THE DRAWINGS

Additional objects and advantages of the present invention will become more readily apparent from the following detailed description of preferred embodiments thereof when taken together with the attached drawings, in which.

DETAILED DESCRIPTION OF THE PREFERRED EMBODIMENTS

Figure 1:
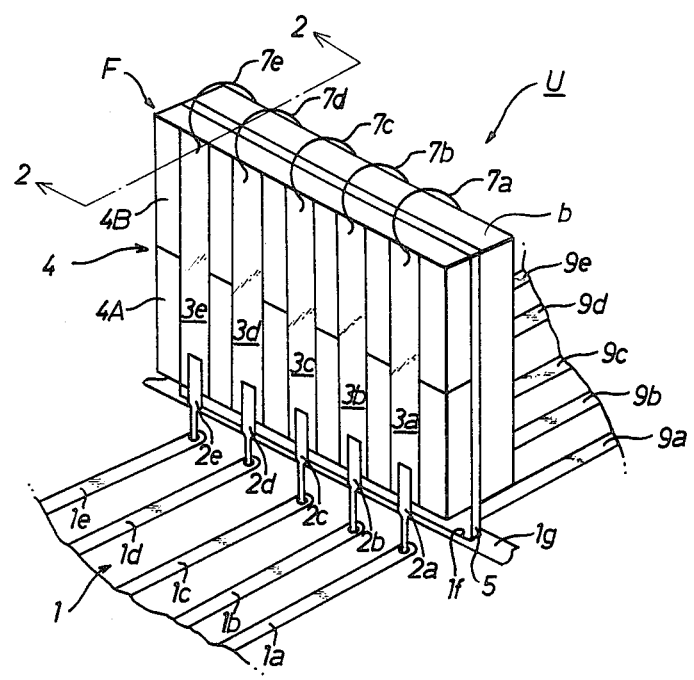
FIG. 1 is a perspective view illustrating a first embodiment of a high frequency filter in accordance with the present invention mounted within an electronic instrument.
Figure 2:
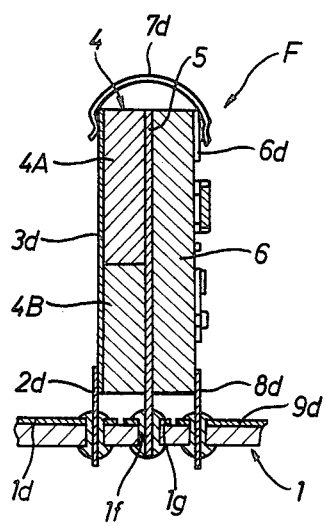
FIG. 2 illustrates a cross-section of the high frequency filter and integrated circuit element taken along line 2—2 in FIG. 1.

Refering now to FIG. 1 of the drawings, there is illustrated a high frequency filter F in accordance with the present invention which is adapted to an electronic instrument U. The electronic instrument U includes a printed circuit board 1 of an insulation material which is assembled in a casing of a metallic conductive material (not shown). The printed circuit board 1 is integrally formed thereon with a plurality of parallel wiring layers 1a-1e and also with a plurality of parallel wiring layers 9a-9e which are arranged to correspond with the wiring layers 1a-1e respectively. In this arrangement, there is provided a predetermined lateral space between the opposed ends of wiring layers 1a-1e and 9a-9e. The electronic instrument U further includes an electronic circuit element 6 of the flat-plate type such as a hybrid integrated circuit, a transistor array or the like. The electronic circuit element 6 is uprightly arranged together with the high frequency filter F on the printed circuit board 1 in the lateral space between the wiring layers 1a-1e and wiring layers 9a-9e, as shown in FIGS. 1 and 2.

Figure 3:
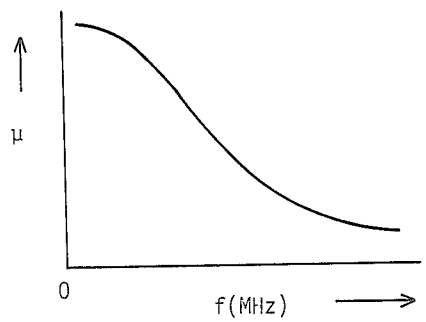
FIG. 3 is a graph illustrating a permeability of a magnetic substance layer in the high frequency filter of FIG. 1 in relation to wireless frequency.
Figure 4:
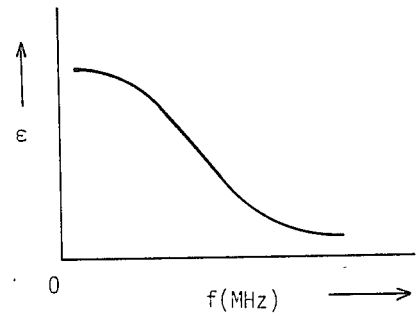
FIG. 4 is a graph illustrating a dielectric constant of a dielectric substance layer in the high frequency filter of FIG. 1 in relation to wireless frequency.

The high frequency filter F comprises a common flat electrode plate 5 of which the lower end is inserted into an elongated land hole 1f in board 1 through a wiring layer 1g and soldered to the wiring layer 1g. On the rear surface of common electrode plate 5, the circuit element 6 is integrally superposed at its rear surface to be supported perpendicularly to the circuit board 1. In the embodiment, the common electrode plate 5 acts a role as a grounding electrode plate which is connected through the wiring layer 1g to the casing or the like. The wiring layer 1g is formed on the board 1 in the predetermined lateral space between the wiring layers 1a-1e and the wiring layers 9a-9e. The high frequency filter F further comprises an insulation substance layer 4 in the form of a baking ceramic plate and a plurality of parallel electrode strips 3a-3e. The insulation substance layer 4 is firmly bonded on the front surface of common electrode plate 5 and is composed of a magnetic substance layer 4A and a dielectric substance layer 4B. The magnetic substance layer 4A is made of a magnetic material of which the permeability $\mu$ changes in relation to wireless frequency f, as is illustrated in FIG. 3. In FIG. 3, it is to be noted that the permeability $\mu$ of magnetic substance layer 4A decreases or increases in accordance with an increase or a decrease of the wireless frequency f. For instance, it is preferable that as the magnetic substance layer 4A, is used ferrite of which the initial permeability is high. The dielectric substance layer 4B is made of a dielectric material of which the dielectric constant $\epsilon$ changes in relation to the wireless frequency f, as is illustrated in FIG. 4. In FIG. 4, it is to be noted that the dielectric constant $\epsilon$ of dielectric substance layer 4B decreases or increases in accordance with an increase or a decrease of the wireless frequency f. For example, it is preferable that as the dielectric substance layer 4B, is used dielectric substance including mainly a compound of ferro-niobate and ferrotungsten.

The electrode strips 3a-3e are printed in parallel to each other on the front surface of insulation layer 4 to be positioned perpendicularly to the printed circuit board 1. These electrode strips 3a-3e each are made of resistive material such as carbon, conductive material such as silver paste or the like. A plurality of metal legs 2a-2e are integrally formed on the lower ends of electrode strips 3a-3e respectively. The metal leg 2a is inserted into a land hole in board 1 through the wiring layer 1a and soldered to the wiring layer 1a. The remaining metal legs 2b-2e are inserted into land holes in board 1 through the wiring layers 1b-1e and soldered to the wiring layers 1b-1e, respectively. As can be well seen in FIGS. 1 and 2, a plurality of curved metal wires or jumper wires 7a-7e are jumped over the insulation layer 4, common electrode plate 5 and electronic circuit element 6 in parallel to each other and soldered or resiliently engaged at their opposite ends with the upper ends of electrode strips 3a-3e and input terminals 6a-6e of electronic circuit element 6. In FIG. 2, only the input terminal 6d of electronic circuit element 6 is illustrated. In addition, a plurality of metal legs 8a-8e are integrally formed on output terminals of electronic circuit element 6, inserted into land holes in board 1 through the wiring layers 9a-9e and soldered to the wiring layers 9a-9e. In FIG. 2, only the metal leg 8d is illustrated.

Figure 5:
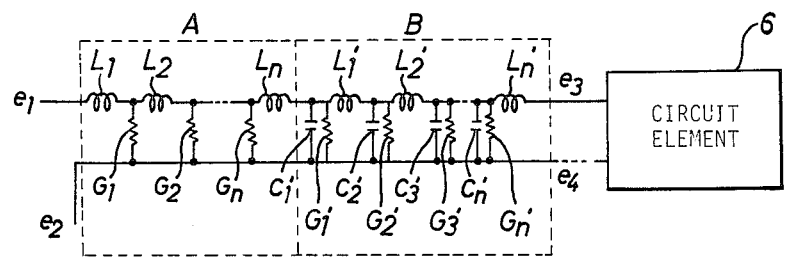
FIG. 5 illustrates a distributed constant circuit of the high frequency filter of FIG. 1.
Figure 6:
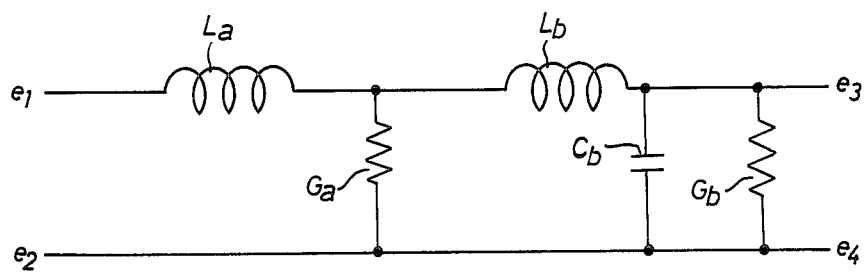
FIG. 6 illustrates an equivalent circuit of the distributed constant circuit shown in FIG. 5.
Figure 7:
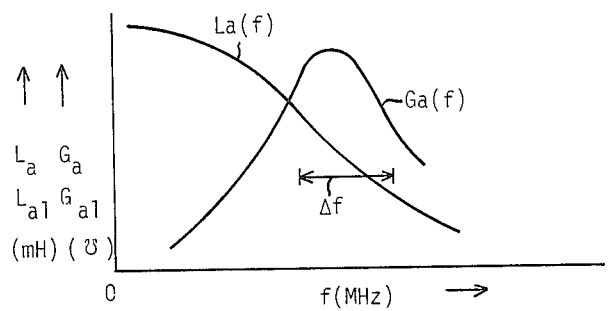
FIG. 7 is a graph illustrating the whole distributed inductance and conductance of the equivalent circuit in relation to wireless frequency.

In such a construction of the high frequency filter F, each of the electrode strips 3a-3b cooperates with the common electrode plate 5 through the magnetic substance layer 4A in a higher region of wireless frequency f to provide a plurality of distributed constant circuits A of the Lecher type each of which includes a plurality of distributed inductances $L_1, L_2 \ldots, L_n$, and a plurality of distributed conductances $G_1, G_2 \ldots, G_n$, as shown in FIG. 5. In the case that the respective distributed constant circuits A are represented by the whole distributed inductance La and the whole distributed conductance Ga, it becomes similar to a lumped element circuit, as illustrated in FIG. 6. In this instance, the whole distributed inductance La corresponds to the distributed inductances $L_1, L_2 \ldots, L_n$, while the whole distributed conductance Ga corresponds to the distributed conductances $G_1, G_2 \ldots, G_n$. Furthermore, the whole distributed inductance La is determined by the permeability $\mu$ of magnetic substance layer 4A and the parallel flat-plate construction formed between the electrode strips 3a-3e and the common electrode plate 5. In FIG. 7, the whole distributed inductance La in relation to wireless frequency f(MHz) is indicated by a characteristic curve La(f). The whole distributed conductance Ga is determined by the loss characteristic of the permeability $\mu$ of layer 4A and the parallel flat-plate construction between the electrode strips 3a-3e and the common electrode plate 5. In FIG. 7, the whole distributed conductance Ga in relation to wireless frequency f(MHz) is indicated by a characteristic curve Ga(f).

In a lower region of the wireless frequency f, each of the electrode strips 3a-3e cooperates with the common electrode plate 5 through the dielectric substance layer 4B to provide a plurality of parallel-plate capacitors which act as a filter, respectively. In a higher region of the wireless frequency f, each of the electrode strips 3a-3e cooperates with the common electrode plate 5 through the dielectric substance layer 4B to provide a plurality of distributed constant circuits of the Lecher type B each of which is cascaded to each of the distributed constant circuits of the Lecher type A and includes a plurality of distributed inductances $L_1', L_2' \ldots, L_n'$, a plurality of distributed capacitances $C_1', C_2' \ldots C_n'$, and a plurality of distributed conductances $G_1', G_2' \ldots G_n'$, as shown in FIG. 5. In the case that each of the distributed constant circuits B is represented by the whole distributed inductance Lb, capacitance Cb and conductance Gb, it becomes similar to a lumped element circuit illustrated in FIG. 6. In this instance, the whole distributed inductance Lb corresponds to the distributed inductances $L_1', L_2' \ldots L_n'$, the whole distributed capacitance Cb corresponds to the distributed capacitances $C_1', C_2' \ldots C_n'$, and the whole distributed conductance Gb corresponds to the distributed conductances $G_1'$, $G_2'$ ... $G_n'$.

Figure 8:
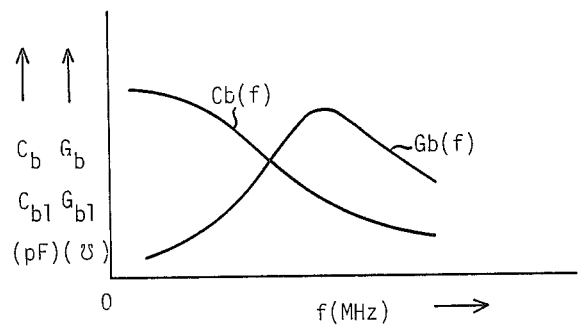
FIG. 8 is a graph illustrating the whole distributed capacitance and conductance of the equivalent circuit in relation to wireless frequency.
Figure 9:
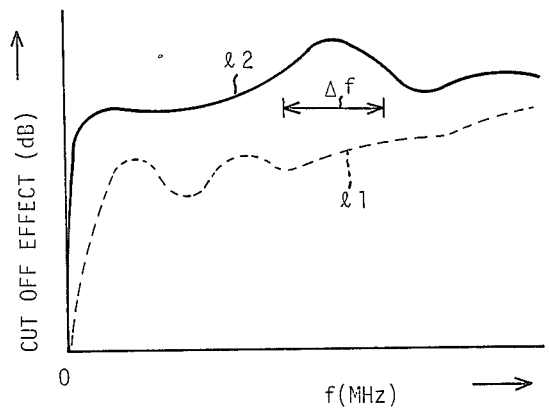
FIG. 9 is a graph illustrating the characteristic attenuation of the high frequency filter shown in FIG. 1.

Furthermore, the whole distributed capacitance Cb and conductance Gb are determined by the dielectric constant $\epsilon$ of layer 4B and the parallel flat-plate construction between the electrode stips 3a–3e and the common electrode plate 5. In FIG. 8, the whole distributed capacitance Cb and conductance Gb are respectively indicated by characteristic curves Cb(f) and Gb(f) in relation to the wireless frequency f(MHz). This means that as is illustrated by a dotted line $l_1$ in FIG. 9, the high frequency filter F acts as a low-pass filter the characteristic of which is effected substantially flat without causing any resonance phenomena in a high frequency region rather than in a low frequency region.

From the above description, the mutual function of magnetic substance layer 4A and dielectric substance layer 4B will be understood as follows. As shown by the characteristic curve La(f) in FIG. 7, the whole distributed inductance La decreases in accordance with an increase of the wireless frequency f. It is, therefore, noted that in a relatively lower region of the wireless frequency, the whole distributed inductance La acts as a high input impedance in relation to the dielectric substance layer 4B to enhance the filtering characteristic of the high frequency filter F. As shown by the characteristic curve Ga(f) in FIG. 7, the whole distributed conductance Ga reaches a maximum value in a relatively higher region $\Delta f$ of the wireless frequency f. It is, therefore, noted that in the higher region of wireless frequency f, the whole distributed conductance Ga acts as a short-circuit impedance in relation to the dielectric substance layer 4B to enhance the filtering characteristic of the high frequency filter F. As a result, the whole filtering characteristic of the high frequency filter F is effected as shown by a solid curve $l_2$ in FIG. 9. As a result, it will be understood that the whole filtering characteristic of high frequency filter F can be improved uniformly over a wider range of wireless frequency f in comparison with the filtering characteristic (see the dotted line $l_1$ of FIG. 9) defined by only the layer 4B and takes a peak value at the relatively higher region $\Delta f$ of wireless frequency f.

Assuming that the electronic instrument receives various electromagnetic waves from a source of electromagnetic waves such as a broadcasting station, an amateur wireless station, a civil wireless station, a personal wireless system, a military radar system and the like, high frequency currents are respectively induced on the wiring layers 1a–1e due to the various electromagnetic waves and then flow into the high frequency filter F. In this instance, total distributed capacitances and conductances between the electrode strips 3a–3e and the common electrode plate 5 change in dependence upon frequencies of the induced high frequency currents related to the above-mentioned frequency characteristics in the dielectric constant $\epsilon$ and permeability $\mu$ of insulation layer 4 to thereby ensure an uniform filtering characteristic of high frequency filter F over a wider range of wireless frequency f. For this reason, the induced high frequency currents flow through the metal legs 2a–2e into the electrode strips 3a–3e and then flow through the common electrode plate 5 and wiring layer 1g into a proper grounding portion such as the casing or the like. This means that the respective high frequency currents are surely filtered toward the grounding portion by the high frequency filter F. Thus, the electronic circuit element 6 receives only normal signal currents from external circuits through the wiring layers 1a–1e, metal legs 2a–2e, electrode strips 3a–3e and curved metal wires 7a–7e to be conditioned in its normal operation without any interference of the induced high frequency currents. In this case, protection of the electronic circuit element 6 from interference of the induced high frequency currents can be attained in a minimum space within the electronic instrument U, because of the superposed construction between the high frequency filter F and the electronic circuit element 6 as described above. Furthermore, induction of high frequency currents between the high frequency filter F and the electronic circuit element 6 can be effectively prevented because the normal signal currents are directly applied by the metal wires 7a–7e into the electronic circuit element 6.

Figure 10:
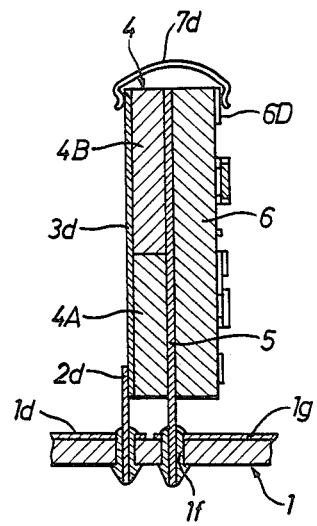
FIG. 10 illustrates a modification of the high frequency filter shown in FIG. 1.

FIG. 10 illustrates a modification of the previous embodiment in which the metal wire 7d is soldered or resiliently engaged at its one end with an output terminal 6D formed on the electronic circuit element 6 in replacement of the input terminal 6d. In the modification, even if high frequency currents are induced on the electrode strips 1a–1e, as previously described, they are effectively blocked by the high frequency filter F from the input and output terminals of electronic circuit element 6. Thus, the electronic circuit element 6 receives at its input terminals 6a–6c and 6e only normal signal currents from the metal wires 7a–7c and 7e, as previously described, and applies a normal signal current from the output terminal 6D to the wiring layer 1d through the metal wire 7d, electrode strip 3d and metal leg 2d without any interference of the induced high frequency currents.

Figure 11:
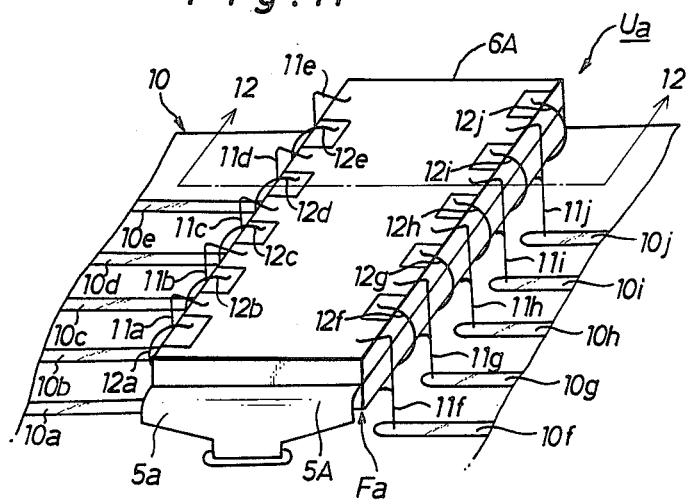
FIG. 11 is a perspective view illustrating a second embodiment of a high frequency filter in accordance with the present invention.

FIG. 11 illustrates a second embodiment of the present invention in which a high frequency filter Fa is adapted to an electronic instrument Ua. The electronic instrument Ua includes a printed circuit board 10 of an insulation material which is assembled in a casing of metallic conductive material (not shown). The printed circuit board 10 is integrally formed thereon with a plurality of parallel wiring layers 10a–10e and also with a plurality of parallel wiring layers 10f–10j. In this arrangement, there is provided a lateral space between the opposed ends of wiring layers 10a–10e and 10f–10j. The wiring layer 10a corresponds with a space between the wiring layers 10f and 10g, and the wiring layer 10b corresponds with a space between the wiring layers 10g and 10h. The wiring layer 10c corresponds with a space between the wiring layers 10h and 10i, the wiring layer 10d corresponds with a space between the wiring layers 10i and 10j, and the wiring layer 10e corresponds with a right space of the wiring layer 10j.

Figure 12:
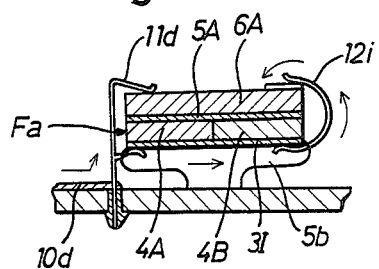
FIG. 12 is a cross-sectional view of the high frequency filter and integrated circuit element taken along line 12—12 in FIG. 11.

The electronic instrument Ua further includes an electronic circuit element 6A of the flat-plate type which is constructed in the form of a dual-in-package type. The circuit element 6A is arranged above and in parallel to the circuit board 1 between the wiring layers 10a–10e and 10f–10j together with the high frequency filter Fa. As shown in FIGS. 11 and 12, the high frequency filter Fa is provided with a common electrode plate 5A and with the insulation substance layer 4 described in the previous embodiment. The common electrode plate 5A is integrally provided at its opposite ends with a pair of conductive legs 5a and 5b which are respectively inserted into elongated land holes in the board 1 through wiring layers and soldered to the same wiring layers. On the upper surface of common electrode plate 5A, the circuit element 6A is integrally superposed at its bottom surface to be supported in parallel to the circuit board 1. In addition, the common electrode plate 5A acts a role as the same grounding electrode plate as the common electrode plate 5 in the previous embodiment. The insulation substance layer 4 is firmly bonded on the bottom surface of common electrode plate 5A.

The high frequency filter Fa is further provided with a plurality of electrode strips 3A to 3J which are printed in parallel to each other on the insulation layer 4 in replacement of the electrode strips 3a–3e described in the previous embodiment (see FIG. 12). These electrode strips 3A to 3J are made of the same material as that of the electrode strips 3a–3e. In FIG. 12, only the electrode strip 3I is illustrated. As can be well seen in FIGS. 11 and 12, a plurality of metal pins 11a–11e are uprightly inserted into land holes in board 1 through the wiring layers 10a–10e and soldered to the wiring layers 10a–10e such that they resiliently engage at their lower arms with the front ends of electrode strips 3B, 3D, 3F, 3H and 3J and at their upper arms with corresponding upper front portions of circuit element 6A. A plurality of metal pins 11f–11j are uprightly inserted into land holes in board 1 through the wiring layers 10f–10j and soldered to the wiring layers 10f–10j such that they resiliently engage at their lower arms with the rear ends of electrode strips 3A, 3C, 3E, 3G and 3I and at their upper arms with corresponding upper rear portions of circuit element 6A. Furthermore, a plurality of curved metal wires or jumper wires 12a–12e are soldered or resiliently engaged at their opposite ends with the front ends of electrode strips 3A, 3C, 3E, 3G and 3I and input terminals of circuit element 6A. A plurality of curved metal wires or jumper wires 12f–12j are soldered or resiliently engaged at their opposite ends with the rear ends of electrode strips 3B, 3D, 3F, 3H and 3J and input terminals of circuit element 6A.

When high frequency currents are respectively induced on the wiring layers 10a–10e and 10f–10j due to various electromagnetic waves as previously described, they are surely filtered toward a grounding portion through the common electrode plate 5A by the high frequency filter Fa having the same filtering characteristic as that of the high frequency filter F in the previous embodiment. Thus, without any interference of the induced high frequency currents, only normal signal currents through the wiring layers 10a–10e are applied to the input terminals of the circuit element 6A through the metal pins 11a–11e, electrode strips 3B, 3D, 3F, 3H and 3J and jumper wires 12f–12j, whereas only normal signal currents through the wiring layers 10f–10j are applied to the input terminals of circuit element 6A through the metal pins 11f–11j, electrode strips 3A, 3C, 3E, 3G and 3I and jumper wires 12a–12e. In this case, protection of the circuit element 6A from interference of the induced high frequency currents can be attained in a minimum space within the electronic instrument Ua, because of the superposed construction between the high frequency filter Fa and the circuit element 6A as described above. Furthermore, induction of high frequency currents between the high frequency filter Fa and the circuit element 6A can be effectively prevented because the normal signal currents are directly applied by the metal pins 11a–11j and jumper wires 12a–12j into the circuit element 6A. In FIG. 12, only a flowing direction of the normal signal current from wiring layer 10d is indicated.

Figure 14:
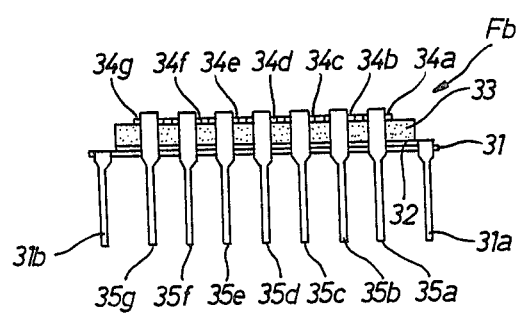
FIG. 14 is a front view of the high frequency filter in FIG. 13.
Figure 15:
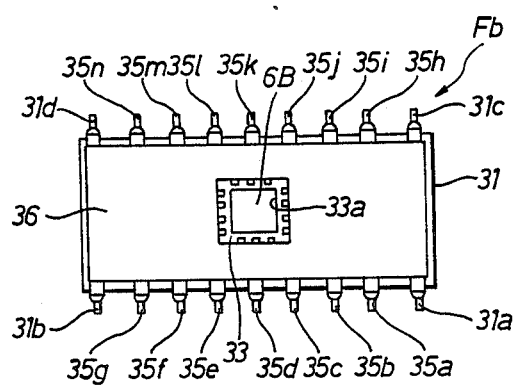
FIG. 15 is a plane view of the high frequency filter covered by a protector cover.
Figure 16:
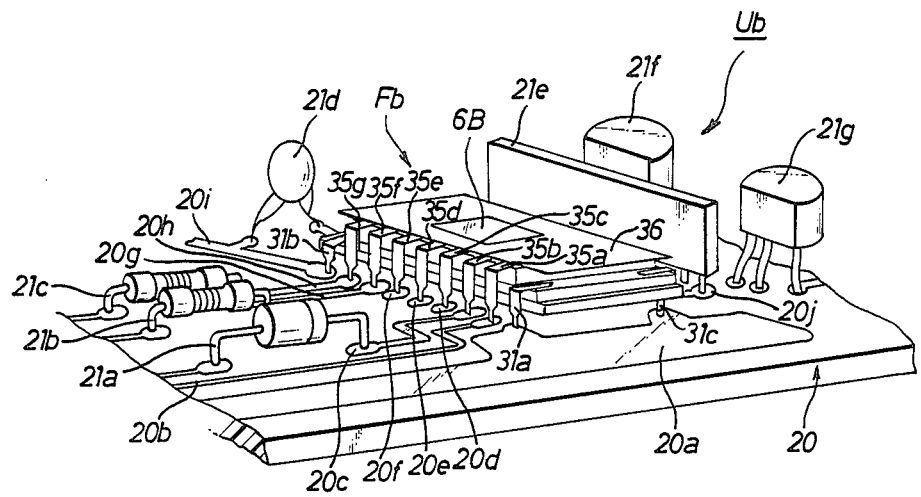
FIG. 16 is a perspective view of the high frequency filter mounted in an electronic instrument.

In FIGS. 13–16, there is illustrated a third embodiment of the present invention in which a high frequency filter Fb is adapted to an electronic instrument Ub. The electronic instrument Ub includes a printed circuit board 20 of an insulation material which is arranged in a casing of metallic conductive material (not shown) and integrally formed thereon with a plurality of wiring layers 20a, 20b, ... 20i, 20j, ... In such an arrangement, there is provided a predetermined space on the printed circuit board 20 among these wiring layers 20a, 20b, ... 20i, 20j..., as shown in FIG. 16. In the embodiment, each of the wiring layers 20a, 20i acts a role as a grounding element or an isolated good conductor surface which is so wide in relation to wireless frequency f. The electronic instrument Ub further includes an integrated circuit element 6B of the chip type which is integrally provided in the high frequency filter Fb. The integrated circuit element 6B is connected by the high frequency filter Fb through the wiring layers 20b 20c ... 20h, 20j ... to various electric elements 21a–21g arranged on the board 20.

Figure 13:
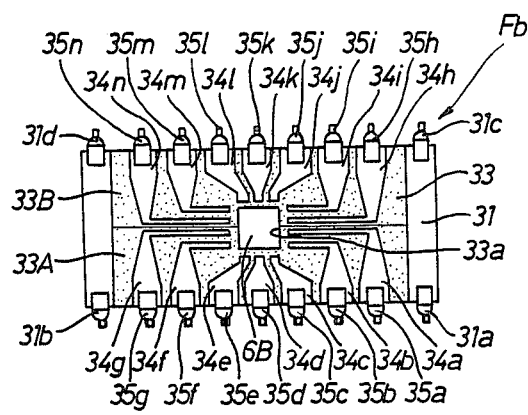
FIG. 13 is a plane view illustrating a third embodiment of a high frequency filter in accordance with the present invention.

As can be well seen in FIG. 16, the high frequency filter Fb is arranged on the printed circuit board 20 in the predetermined space among the wiring layers 20a, 20b ... 20i, 20j ... As shown in FIGS. 13–15, the high frequency filter Fb comprises a base plate 31 and a common electrode plate 32 which is secured on the base plate 31 to act a role as a grounding plate together with the base plate 31. The base plate 31 is integrally provided at its corners with L-shaped metal legs 31a–31d which are respectively inserted into land holes in the board 20 and soldered to the wiring layers 20a, 20i and the like to support the base plate 31 above the board 20. The high frequency filter Fb further comprises an insulation substance layer 33 in the form of a baking ceramic plate formed on the common electrode plate 32, and a plurality of curved electrode strips 34a–34n integrally formed on the upper surface of insulation substance layer 33. The insulation substance layer 33 is formed thereon with a central hole 33a in which the integrated circuit element 6B is disposed to be connected at its input and output terminals to the inner ends of the electrode strips 34a–34n.

The insulation substance layer 33 comprises a magnetic substance layer 33A and a dielectric substance layer 33B. The magnetic substance layer 33A is made of the same magnetic material as that of the magnetic substance layer 4A described in the previous embodiment, and the dielectric substance layer 33B is made of the same dielectric material as that of the dielectric substance layer 4B described in the previous embodiment. This means that the magnetic substance layer 33A has the same permeability-wireless frequency characteristic as that of the magnetic substance layer 4A and also that the dielectric substance layer 33B has the same dielectric constant-wireless frequency characteristic as that of the dielectric substance layer 4B. The electrode strip 34a is integrally provided at its outer end with an L-shaped metal leg 35a which is inserted through the wiring layer 20b into a land hole in the board 20 and soldered to the wiring layer 20b. The remaining electrode strips 34b–34n are respectively provided at their outer ends integrally with L-shaped metal legs 35b–35n which are inserted through the wiring layers 20c ... 20h, 20j ... into land holes in the board 20 and soldered to the same wiring layers, respectively. In addition, the electrode strips 34a–34n are electrically connected at their inner ends with the input and output terminals of circuit element 6B. In FIG. 15, the reference numeral 36 indicates a protector cover for the high frequency filter Fb.

Figure 17:
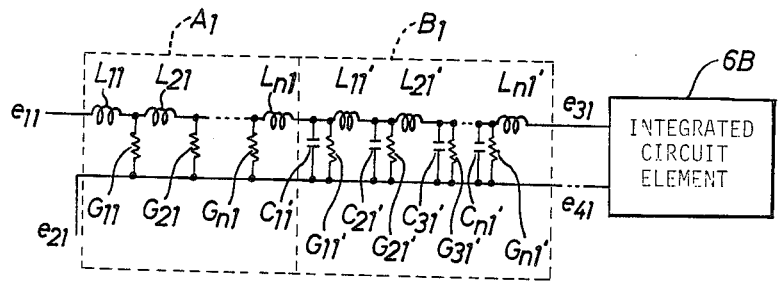
FIG. 17 illustrates a distributed constant circuit of the high frequency filter of FIG. 13.
Figure 18:
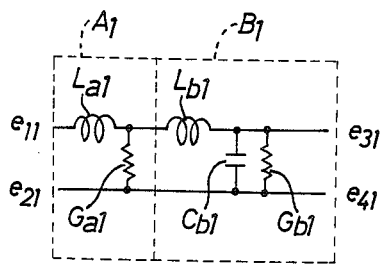
FIG. 18 illustrates an equivalent circuit of the distributed constant circuit shown in FIG. 17.

In such a construction of the high frequency filter Fb, each of the electrode strips $34a-34n$ cooperates with the common electrode plate 32 through the magnetic substance layer 33A in a higher region of wireless frequency f to provide a plurality of distributed constant circuits $A_1$ of the Lecher type each of which includes a plurality of distributed inductances $L_{11}, L_{21} \ldots, L_{n1}$, and a plurality of distributed conductances $G_{11}, G_{21} \ldots G_{n1}$, as shown in FIG. 17. In the case that the respective distributed constant circuits $A_1$ are represented by the whole distributed inductance $L_{a1}$ and the whole distributed conductance $G_{a1}$, it becomes similar to a lumped element circut illustrated in FIG. 18. In this case, the whole distributed inductance $L_{a1}$ corresponds to the distributed inductances $L_{11}, L_{21} \ldots L_{n1}$, while the whole distributed conductance $G_{a1}$ corresponds to the distributed conductances $G_{11}, G_{21} \ldots G_{n1}$. Furthermore, the whole distributed inductance $L_{a1}$ is determined by the permeability $\mu$ of magnetic substance layer 33A and the parallel flat-plate construction formed between the electrode strips $34a-34n$ and the common electrode plate 32. In this case, the whole distributed inductance $L_{a1}$ in relation to wireless frequency f (MHz) is indicated by the characteristic curve $La(f)$ shown in FIG. 7. The whole distributed conductance $G_{a1}$ is determined by the loss characteristic of the permeability of layer 33A and the parallel flat-plate construction between the electrode strips $34a-34n$ and the common electrode plate 32. In this case, the whole distributed conductance $G_{a1}$ in relation to wireless frequency f(MHz) is indicated by the characteristic curve $Ga(f)$ shown in FIG. 7.

In a lower region of the wireless frequency f, each of the electrode strips $34a-34n$ cooperates with the common electrode plate 32 through the dielectric substance layer 33B to provide a plurality of parallel-plate capacitors which act as a filter. In a higher region of the wireless frequency f, each of the electrode strips $34a-34n$ cooperates with the common electrode plate 32 through the dielectric substance layer 33B to provide a plurality of distributed constant circuits of the Lecher type $B_1$ each of which is cascaded to each of the distributed constant circuits of the Lecher type $A_1$ and includes a plurality of distributed inductances $L_{11}', L_{21}' \ldots L_{n1}'$, a plurality of distributed capacitances $C_{11}', C_{21}' \ldots C_{n1}$, and a plurality of distributed conductances $G_{11}', G_{21}' \ldots G_{n1}'$, as shown in FIG. 17. In the case that each of the distributed constant circuits $B_1$ is represented by the whole distributed inductance $L_{b1}$, capacitance $C_{b1}$ and conductance $G_{b1}$, it becomes similar to a lumped element circuit illustrated in FIG. 18. In this instance, the whole distributed inductance $L_{b1}$ corresponds to the distributed inductances $L_{11}', L_{21}' \ldots L_{n1}'$, the whole distributed capacitance $C_{b1}$ corresponds to the distributed capacitances $C_{11}', C_{21}' \ldots C_{n1}'$, and the whole distributed conductance $G_{b1}$ corresponds to the distributed conductances $G_{11}', G_{21}' \ldots G_{n1}'$.

Furthermore, the whole distributed capacitance $C_{b1}$ and conductance $G_{b1}$ are determined by the dielectric constant $\epsilon$ of layer 33B and the parallel flat-plate construction between the electrode strips $34a-34n$ and the common electrode plate 32. In this case, the whole distributed capacitance $C_{b1}$ and conductance $G_{b1}$ are respectively indicated by the characteristic curves $Cb(f)$ and $Gb(f)$ in relation to the wireless frequency f(MHz), shown in FIG. 8. This means that as is illustrated by the dotted line $l_1$ in FIG. 8, the high frequency filter Fb acts as a low-pass filter the characteristic attenuation of which is effected substantially flat without causing any resonance phenomena in a high frequency region rather than in a low frequency region.

From the above description, the mutual function of magnetic substance layer 33A and dielectric substance layer 33B will be understood as follows. As shown by the characteristic curve $La(f)$ in FIG. 7, the whole distributed inductance $L_{a1}$ decreases in accordance with increase of the wireless frequency f. It is, therefore, noted that in a relatively lower region of the wireless frequency, the whole distributed inductance $L_{a1}$ acts as a high input impedance in relation to the dielectric substance layer 33A to enhance the filtering characteristic of the high frequency filter Fb. As shown by the characteristic curve $Ga(f)$ in FIG. 7, the whole distributed conductance $G_{a1}$ reaches a maximum value in a relatively higher region $\Delta f$ of the wireless frequency f. It is, therefore, noted that in the higher region of wireless frequency f, the whole distributed conductance $G_{a1}$ acts as a short-circuit impedance in relation to the dielectric substance layer 33B to enhance the filtering characteristic of the high frequency filter Fb. As a result, the whole filtering characteristic of the high frequency filter Fb is effected as shown by a solid curve $l_2$ in FIG. 9. As a result, it will be understood that the whole filtering characteristic of high frequency filter Fb can be improved uniformly over a wider range of wireless frequency f in comparison with the filtering characteristic (see the dotted line $l_1$ of FIG. 9) defined by only the layer 4B and takes a peak value at the relatively higher region $\Delta f$ of wireless frequency f.

When high frequency currents are respectively induced on the wiring layers $20b, \ldots 20h, 20j \ldots$ due to various electromagnetic waves as previously described, they flow into the high frequency filter Fb. In this instance, total distributed capacitances and conductances between the electrode strips $34a-34n$ and the common electrode plate 32 change in dependence upon frequencies of the induced high frequency currents related to the above-mentioned frequency characteristics in the dielectric constant $\epsilon$ and permeability $\mu$ of insulation layer 33 to thereby ensure uniform filtering characteristic of high frequency filter Fb over a wider range of wireless frequency f. From this reason, the induced high frequency currents flow through the metal legs $35a-35n$ into the electrode strips $34a-34n$ and then flow through the common electrode plate 32, base plate 31 and wiring layers $21a, 20i$ into a proper grounding portion such as the casing or the like. This means that the respective high frequency currents are surely filtered toward the grounding portion by the high frequency filter Fb. Thus, the integrated circuit element 6B receives only normal signal currents through the wiring layers $20b, 20c, \ldots 20h, 20j \ldots$, metal legs $35a-35n$ and electrode strips $34a-34n$ to be conditioned in its normal operation without any interference of the induced high frequency currents. In this case, protection of the integrated circuit element 6B from interference of the induced high frequency currents can be attained in a minimum space within the electronic instrument Ub, because of disposition of the integrated circuit element 6B into the hole $33a$ of insulation substance layer 33 as described above. Furthermore, induction of high frequency currents between the high frequency filter Fb and the integrated circuit element 6B can be effectively prevented owing to direct connections between the inner ends of electrode strips 34a–34n and the terminals of integrated circuit element 6B. Additionally, high frequency currents induced in the integrated circuit element 6B can be also effectively filtered or reduced by the high frequency filter Fb.

Figure 19:
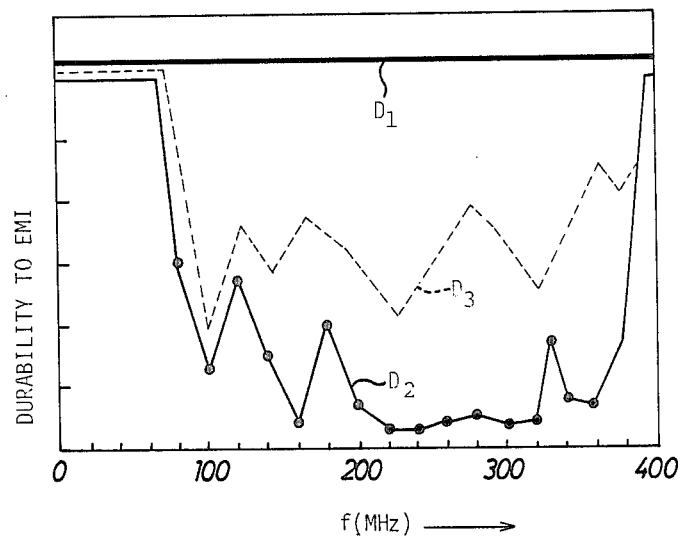
FIG. 19 depicts graphs indicating susceptibility to electromagnetic wave interference in relation to wireless frequency.

FIG. 19 depicts experimental results regarding susceptibility (V/M) to electromagnetic wave interference (or EMI) in the electronic instrument Ub in comparison with prior art. In the figure, a linear line $D_1$ indicates susceptibility to EMI in the electronic instrument Ub having the high frequency filter Fb. A solid curve $D_2$ illustrates susceptibility to EMI in an electronic instrument without any high frequency filter, and a dotted curve $D_3$ illustrates susceptibility to EMI in an electronic instrument including a capacitor of the chip type as a high frequency filter. In other words, the linear line $D_1$ indicates that susceptibility to EMI can be uniformly enhanced over a wider range of wireless frequency f in comparison with that defined by the solid curve $D_2$ or dotted curve $D_3$.

Figure 20:
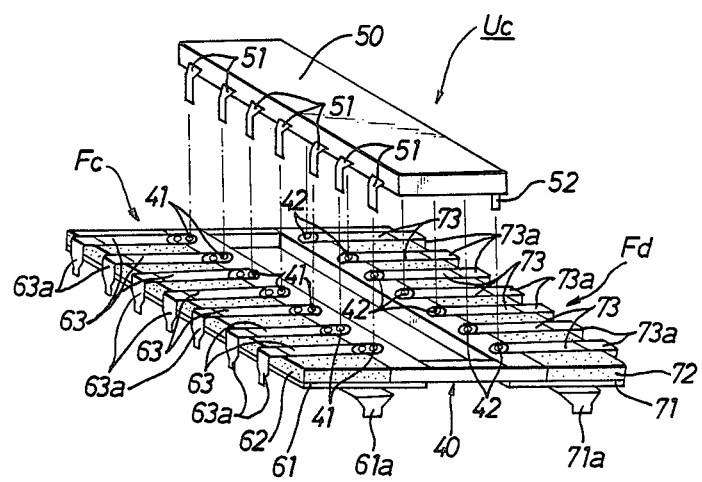
FIG. 20 is a perspective view illstrating a fourth embodiment of a high frequency filter in accordance with the present invention.

FIG. 20 illustrates a fourth embodiment of the present invention in which a pair of high frequency filters Fc and Fd are adapted to an electronic instrument Uc. The electronic instrument Uc includes a printed circuit board of an insulation material which is assembled in a casing of metallic conductive material. The electronic instrument Uc further includes an integrated circuit or IC socket 40 and an integrated circuit element 50. The IC socket 40 is supported by way of the high frequency filters Fc, Fd above and in parallel to the printed circuit board, and the integrated circuit element 50 is inserted at its conductive legs 51—51 and 52—52 into conductive pin hole portions 41—41 and 42—42 of the IC socket 40.

The high frequency filter Fc comprises a common electrode plate 61 of which the opposite metal legs 61a, 61a are inserted into land holes in the circuit board and soldered to a grounding or wiring layer formed on the circuit board to be positioned in parallel to the circuit board. The high frequency filter Fc further comprises an insulation substance layer 62 and a plurality of electrode strips 63—63. The insulation substance layer 62 is firmly bonded on the common electrode plate 61 together with a front socket portion of IC socket 40 to contact with the same front socket portion. In this case, the insulation substance layer 62 is made of the same materials as those of the insulation substance layer 4 described in the previous embodiment. The electrode strips 63—63 are printed in parallel to each other on the insulation substance layer 62 and soldered at their rear ends to the conductive pin hole portions 41—41 of IC socket 40. The electrode strips 63—63 are integrally provided at their front ends with metal legs 63a—63a which are inserted into land holes in the circuit board and soldered to wiring layers formed on the printed circuit board.

The high frequency filter Fd comprises a common electrode plate 71 of which the opposite metal legs 71a, 71a are inserted into land holes in the circuit board and soldered to a grounding or wiring layer, formed on the circuit board, to be positioned in parallel to the circuit board. The high frequency filter Fd further comprises an insulation substance layer 72 and a plurality of electrode strips 73—73. The insulation substance layer 72 is firmly bonded on the common electrode plate 71 together with a rear socket portion of IC socket 40 to contact with the same rear socket portion. In this case, the insulation substance layer 72 is made of the same materials as those of the insulation substance layer 4 described in the previous embodiment. The electrode strips 73—73 are printed in parallel to each other on the insulation substance layer 72 and soldered at their rear ends to the conductive pin hole portions 42—42 of IC socket 40. The electrode strips 73—73 are integrally provided at their front ends with metal legs 73a—73a which are inserted into land holes in the circuit board and soldered to wiring layers formed on the printed circuit board.

When high frequency currents are respectively induced on the wiring layers of the printed circuit board due to various electromagnetic waves as previously described, they flow into the high frequency filters Fc and Fd. Then, owing to function of high frequency filters Fc, Fd having the same filtering characteristic as that of the high frequency filter F, the induced high frequency currents flow through the metal legs 63a—63a and 73a—73a—73a into the electrode strips 63—63 and 73—73 and then flow through the common electrode plates 61, 71 into proper grounding portions. Thus, the integrated circuit element 50 receives only signal currents through the metal legs 63a—63a and 73a—73a, electrode strips 63—63 and 73—73 and conductive pin hole portions 41—41 and 42—42 to be conditioned in its normal operation without any interference of the induced high frequency currents. In this case, protection of the integrated circuit element 50 from interference of the induced high frequency currents can be attained in a minimum space within the electronic instrument Uc, because of sandwich construction of the IC socket 40 between insulation substance layers 62, 72 as described above. Furthermore, induction of high frequency currents between the high frequency filters Fc, Fd and the integrated circuit element 50 can be effectively prevented owing to direct connections between the rear ends of electrode strips 63—63 and 73—73 and the conductive legs 51—51 and 52—52 of integrated circuit element 50.

Figure 21:
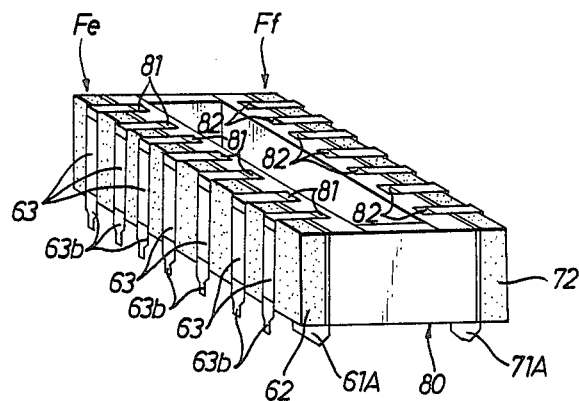
FIGS. 21-23 illustrate modifications of the fourth embodiment respectively.

FIG. 21 illustrates a modification of the fourth embodiment in which a pair of high frequency filters Fe and Ff are mounted on the printed circuit board in replacement of the high frequency filters Fc and Fd, and an IC socket 80 is sandwiched between the high frequency filters Fe and Ff in replacement of the IC socket 40. The integrated circuit element 50 is inserted at its conductive legs 51—51 and 52—52 into conductive pin hole portions 81—81 and 82—82 of IC socket 80.

The high frequency filters Fe, Ff comprise respectively common electrode plates 61A, 71A which sandwich the IC socket 80 and are inserted at their lower ends into land holes in the circuit board. The lower ends of common electrode plates 61A, 71A are soldered to wiring or grounding layers formed on the circuit board. The high frequency filter Fe further comprises the insulation substance layer 62 and electrode strips 63—63 described in the fourth embodiment. The insulation substance layer 62 is bonded on the common electrode plate 61. The electrode strips 63—63 are soldered at their upper ends with the conductive pin hole portions 81—81 of IC socket 80. A plurality of metal legs 63b—63b are formed integrally on the lower ends of electrode strips 63—63 in replacement of the metal legs 63a—63a and soldered to the wiring layers, as previously described.

The high frequency filter Ff further comprises the insulation substance layer 72 and electrode strips 73—73 described in the fourth embodiment. Insulation substance layer 72 is bonded on the common electrode plate 71. The electrode strips 73—73 are soldered at their upper ends with the conductive pin hole portions 82—82 of IC socket 80. A plurality of metal legs 73b—73b (not shown) are formed integrally on the lower ends of electrode strips 73—73 in replacement of the metal legs 73a—73a and soldered to the wiring layers, as previously described. In this modification, the high frequency filters Fe, Ff cooperate with the IC socket 80 to provide the same effect as that in the fourth embodiment.

Figure 22:
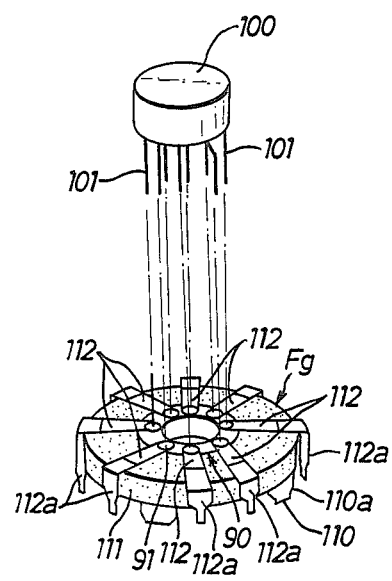

FIG. 22 illustrates another modification of the fourth embodiment in which an annular high frequency filter Fg is mounted on the printed circuit board in replacement of the high frequency filters Fc and Fd, and an annular IC socket 90 for an integrated circuit element 100 of the cylindrical package type such as an operational amplifier is disposed in the high frequency filter Fg in replacement of the IC sccket 40. The integrated circuit element 100 is inserted at its conductive legs 101—101 into conductive pin hole portions 91—91 of IC socket 90. The high frequency filter Fg comprises an annular common electrode plate 110 of which metal legs 110a are inserted into land holes in the printed circuit board and soldered to wiring or grounding layers formed on the circuit board. The common electrode plate 110 is interally provided therein with the IC socket 90. The high frequency filter Fg further comprises an annular insulation substance layer 111 of which the inner surface is bonded on the common electrode plate 110. In this case, the insulation substance layer 111 is made of the same materials as those of the insulation substance layer 4 described in the previous embodiment.

A plurality of electrode strips 112—112 are printed radially on the insulation substance layer 111 and soldered at their inner ends to the conductive pin hole portions 91—91 of IC socket 90. The electrode strips 112—112 are integrally provided at their outer ends with metal legs 112a—112a which are inserted into land holes in the circuit board and soldered to wiring layers formed on the circuit board. In this modification, the high frequency filter Fg cooperates with the IC socket 90 to provide the same effect as that in the fourth embodiment.

Figure 23:
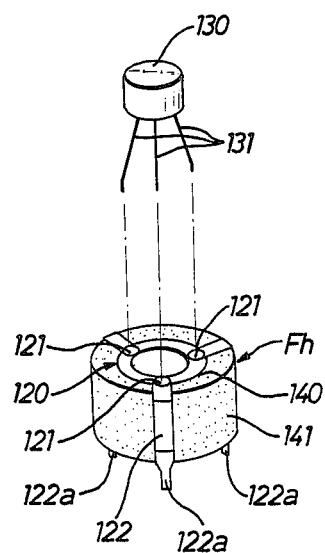

FIG. 23 illustrates still another modification of the fourth embodiment in which a cylindrical high frequency filter Fh is mounted on the printed circuit board in replacement of the high frequency filters Fc and Fd, and a cylindrical transistor socket 120 for a transistor 130 is disposed in the high frequency filter Fh in replacement of the IC socket 40. The transistor 130 is inserted at its conductive legs 131—131 into conductive pin hole portions 121—121 of transistor socket 120. The high frequency filter Fh comprises a cylindrical common electrode plate 140 of which metal legs are inserted into land holes in the printed circuit board and soldered to wiring or grounding layers formed on the circuit board. The common electrode plate 140 is integrally provided therein with the transistor socket 120. The high frequency filter Fh further comprises a cylindrical insulation substance layer 141 of which the inner surface is bonded on the common electrode plate 140. In this case, the insulation substance layer 141 is made of the same materials as those of the insulation substance layer 4 described in the previous embodiment.

A plurality of electrode strips 122—122 are printed in parallel to each other on the outer surface of insulation substance layer 141 and soldered at their inner ends to the conductive pin hole portions 121—121 of transistor socket 120. The electrode strips 122—122 are integrally provided at their lower ends with metal legs 122a—122a which are inserted into land holes in the circuit board and soldered to wiring layers formed on the circuit board. In this modification, the high frequency filter Fh cooperates with the transistor socket 120 to provide the same effect as that in the fourth embodiment.

For the actual practices of the present invention, each of the insulation substance layers F and Fa-Fh may be made of only the same material as that of one of the magnetic substance layer 4A and dielectric substance layer 4B as previously described.

Having now fully set forth both structure and operation of preferred embodiments of the concept underlying the present invention, various other embodiments as well as certain variations and modifications of the embodiments herein shown and described will obviously occur to those skilled in the art upon becoming familiar with said underlying concept. It is to be understood, therefore, that within the scope of the appended claims, the invention may be practiced otherwise than as specifically set forth herein.

What is claimed is:

1. A strip-line high frequency filter adapted for use in combination with an internal electronic circuit element, of the flat-plate type such as a hybrid integrated circuit element or a transistor array, arranged to be carried on a circuit board of an insulation material and to be connected to an external electric circuit, the high frequency filter comprising:

a flat electrode plate having first and second surfaces and mounted on said circuit board to be grounded;

an insulation substance layer integrally formed on the first surface of said electrode plate, said insulation substance layer being made of a dielectric material whose dielectric constant decreases or increases in accordance with an increase or a decrease of wireless frequency applied thereto; and an electrode strip integrally formed on said insulation substance layer for connection to said external electric circuit;

wherein said internal electronic circuit element is integrally provided on the second surface of said electrode plate to be carried in place and connected to said electrode strip.

2. A strip-line high frequency filter as claimed in claim 1, wherein said flat electrode plate is arranged perpendicularly to said circuit board and fixedly mounted on said circuit board at the lower end thereof, and wherein said internal electronic circuit element is secured to the second surface of said flat electrode plate.

3. A strip-line high frequency filter as claimed in claim 1, wherein said flat electrode plate is arranged in parallel with said circuit board and fixedly mounted on said circuit board at the opposite ends thereof, and wherein said internal electronic circuit element is secured to the upper surface of said flat electrode plate and said insulation substance layer is integrally formed on the bottom surface of said flat electrode plate.

4. A strip-line high frequency filter as claimed in claim 3, wherein said internal electronic circuit element is in the form of an integrated circuit element disposed within said insulation substance layer and connected to said electrode strip.

5. A strip-line high frequency filter adapted for use in combination with an itnernal electronic circuit element of the flat-plate type such as a hybrid integrated circuit element or a transistor array arranged to carried on a circuit board of an insulation material and to be connected to an external electric circuit, the high frequency filter comprising:
   a common flat electrode plate having first and second surfaces and mounted on said circuit board to be grounded;
   an insulation substance layer integrally formed on the first surface of said electrode plate, said insulation substance layer being made of a dielectric material whose dielectric constant decreases or increases in accordance with an increase or a decrease of wireless frequency applied thereto; and
   a plurality of spaced electrode strips integrally formed on said insulation substance layer for connection to said external electric circuit;
   wherein said internal electronic circuit element is integrally provided on the second surface of said electrode plate to be carried in place and connected to said electrode strips.

6. A strip-line high frequency filter as claimed in claim 5, said flat electrode plate is arranged in parallel with said circuit board and fixedly mounted on said circuit board at the opposite ends thereof, and wherein said electrode strips are arranged in parallel to each other on said insulation substance layer and connected at their one ends to a socket for connection to said electronic circuit element.

7. A strip-line high frequency filter as claimed in claim 5, wherein said flat electrode plate is arranged perpendicularly to said circuit board and fixedly mounted on said circuit board at the lower end thereof, said electrode strips being arranged in parallel to each other on said insulation layer and connected at their one ends to a socket for connection to said electronic circuit element.

8. A strip-line frequency filter as claimed in claim 1, wherein said insulation substance layer includes a first section made of a dielectric material whose dielectric constant decreases or increases in accordance with an increase or a decrease of wireless frequency applied thereto and further includes a second section made of a magnetic material whose permeability decreases or increases in accordance with an increase or a decrease of wireless frequency applied thereto.

9. A strip-line high frequency filter as claimed in claim 8, wherein the first section of said insulation substance layer is made of a compound of ferro-niobate and ferrotungsten, and the second section of said insulation substance layer is made of ferrite.

10. A strip-line high frequency filter as claimed in claim 5, wherein said flat electrode plate is arranged in parallel with said circuit board and fixedly mounted on said circuit board at the opposite ends thereof, and wherein said internal electronic circuit element is in the form of an integrated circuit element disposed within said insulation substance layer and connected to said electrode strips.

11. A high frequency filter adapted for use in combination with an internal electronic circuit element arranged to be carried on a circuit board of an insulation material and to be connected to an external electric circuit, the high frequency filter comprising:
   an annular electrode plate mounted on said circuit board to be grounded, said electrode plate being provided at the inner periphery thereof with a cylindrical socket for connection to said electronic circuit element;
   an annular insulation substance layer integrally formed on said electrode plate, said insulation substance layer being made of a dielectric material whose dielectric constant decreases or increases in accordance with an increase or a decrease of wireless frequency applied thereto; and
   a plurality of circumferentially spaced radial elecrode strips integrally provided on said insulation substance layer and connected to at their inner ends to said socket and at their outer ends to said external electric circuit.

12. A high frequency filter as claimed in claim 11, wherein said electronic circuit element is an integrated circuit element of the cylindrical package type connected to said socket.

13. A high frequency filter as claimed in claim 11, wherein said electronic circuit element is a single transistor connected to said socket.

14. A strip-line frequency filter as claimed in claim 5, wherein said insulation substance layer includes a first section made of a dielectric material whose dielectric constant decreases or increases in accordance with an increase or a decrease of wireless frequency applied thereto and further includes a second section made of a magnetic material whose permeability decreases or increases in accordance with an increase or a decrease of wireless frequency applied thereto.

15. A strip-line high frequency filter as claimed in claim 14, wherein the first section of said insulation substance layer is made of a compound of ferro-niobate and ferrotungsten, and the second section of said insulation substance layer is made of ferrite.

* * * * *